United States Patent
Odagiri et al.

(10) Patent No.: US 6,873,069 B1
(45) Date of Patent: Mar. 29, 2005

(54) VERY THIN FAN MOTOR WITH ATTACHED HEAT SINK

(75) Inventors: Kinya Odagiri, Tokyo (JP); Kouji Oki, Tokyo (JP); Shingo Suzuki, Tokyo (JP)

(73) Assignee: Namiki Precision Jewel Co., Ltd., Tokyo (JP)

( * ) Notice: Subject to any disclaimer, the term of this patent is extended or adjusted under 35 U.S.C. 154(b) by 0 days.

(21) Appl. No.: 09/680,323

(22) Filed: Oct. 6, 2000

(30) Foreign Application Priority Data

Mar. 23, 2000 (JP) ........................................ 2000-083012

(51) Int. Cl.[7] ................................................. H05K 7/20
(52) U.S. Cl. ...................... 310/64; 310/63; 310/156.32; 310/67 R; 165/122; 165/80.3; 361/695; 361/697; 417/423.1; 417/423.14; 415/178
(58) Field of Search ............................... 310/62, 63, 64, 310/156.32; 361/695, 697; 415/178; 165/121–126, 803; 417/423.1, 423.8, 423.14, 354

(56) References Cited

U.S. PATENT DOCUMENTS

| | | | | |
|---|---|---|---|---|
| 5,583,746 A | * | 12/1996 | Wang | ........................ 361/697 |
| 5,979,541 A | * | 11/1999 | Saito | ........................ 165/80.3 |
| 6,132,170 A | * | 10/2000 | Horng | ........................ 415/178 |

* cited by examiner

Primary Examiner—Karl Tamai
(74) Attorney, Agent, or Firm—Eric J. Robinson; Robinson Intellectual Property Law Office, P.C.

(57) ABSTRACT

A very thin fan motor with an attached heat sink that has high heat radiation and air cooling effects in a small, flat, thin package, that has a simple and easily assembled overall structure as a fan motor, and that has superior cooling efficiency. A flat fan mounted in various kinds of electronic equipment that need to radiate heat, and particularly mounted directly on the CPU, characterized by having a fan motor mechanism that comprises a heat plate that supports a rotor fan that can rotate in a central position and that has a contact surface that matches the shape of the external surface of the item (such as a CPU) to be cooled, rotor magnets that are part of the rotor fan and are positioned around the periphery on the surface of the heat plate, and a stator coil substrate, by having multiple metal heat radiation fins with excellent thermal conductivity, which are thin heat-radiating fins, arranged in parallel at a fixed interval on the heat plate pointing outward from the rotor fan as cooling heat-radiation fins, and by combining the function of cooling heat sink with the heat radiation fins that conduct the heat absorbed from the heat plate and radiate it away by the action of the air moved by the rotor fan.

5 Claims, 6 Drawing Sheets

VERY THIN FAN MOTOR WITH ATTACHED HEAT SINK

BACKGROUND OF THE INVENTION

1. Field of the Invention

This invention concerns cooling fan motors mounted in various kinds of electronic equipment that require heat radiation treatment, such as high performance CPU integrated circuits like microprocessors or IC circuit boards mounted in PCs (personal computers), and improvement of small, flat brushless motors suited to use in such cooling fan motors.

2. Description of the Related Art

As portable telephones, portable PCs and other kinds of electronic equipment have become smaller and more compact in recent years, various parts used within such equipment have necessarily become miniaturized. Electronics technology and semiconductor integration technology have undergone remarkable development in the fields of portable terminals for business mobile computing, desktop PCs, FAX machines, printers and other office automation equipment, drive and control devices for factory automation equipment including precision machining equipment and small industrial robots and so on, and this trend of miniaturization can be expected to continue to accelerate.

However, the biggest obstacle to further downsizing of this portable equipment is the increased heat density of electronic circuits and internal elements such as semiconductors. That is, the increased volume of heat per unit-time, or heat wattage, within the equipment constitutes a major, urgent problem to be resolved in order for higher performance CPU integrated circuits to continue to perform vigorous operations.

With the goal of resolving the CPU heat problem raised by this miniaturization and densification, numerous manufacturers have entered the marketplace with small cooling fans, cooling pipes, heat radiation fins, electronic cooling elements and various other cooling devices and parts that can withstand the rise of temperatures within equipment. All of these have provided some degree of cooling capacity, but their size has not been as small as desired. They have not been of a size suited to portable electronic equipment with the smallness, lightness and portability required of the very thin, notebook-sized personal computers of recent years.

For example, notebook PC models with the most advanced high-performance CPUs of 600 MHz or more that are now on the market have adopted what is called the "interflap system" to efficiently cool the CPU and the personal computer itself. In this, when the liquid crystal display is opened, the rear of the personal computer itself is tilted up to form a space below it, and air is pulled in by a large fan motor mounted in a tunnel-shaped "inter-cooler diecast" and blown from right to left across the CPU surface, then forcefully exhausted along with the heat from within the PC.

When viewed in the direction of the thickness, however, for space reasons this is done by putting a large fan mechanism in another location, offset from a position on the CPU. This is excellent from the perspective of efficient cooling of the PC as a whole, but it is of course not a structure that can cope with slimmed down equipment.

Because the light and slim bodies of the latest notebook personal computers do not have installation space, particularly in the direction of the thickness of the case, counter-measures against heat are an important problem in terms of taking advantage of the capabilities of high-performance CPUs. A very thin, high-efficiency fan mechanism that directly cools CPU parts has become indispensable for future high-performance notebook models.

The Japanese Design Patent 1057608, submitted earlier by the present inventors, can be mentioned as an example of a conventional thin fan motor. This thin fan motor with attached heat sink 200, as shown in FIG. 5 (which differs from the actual outward appearance in order to explain the internal structure) and FIG. 6, is constituted as follows. There is a heat plate 34 fixed to various heat-producing pieces of equipment that require the radiation of heat. This heat plate 34 has a fan motor rotor section roughly in its center. Multiple heat radiation blocks 32a, 32b . . . that rise from the inner surface of the heat plate 34 are lined up radially in a circle centered on the rotational axis of the rotors outside the reach of the rotor blades 30a, 30b . . . The outer periphery has openings as outlets for the moving air. The radiation blocks 32a, 32b . . . are covered by a polymer sheet 24 of the circuit board 22, which is fixed in place by fittings (part D) that engage the corner walls of the heat plate 34, and the air set in motion the rotor fan forcefully cool the heat radiation blocks 32a, 32b . . . The rotor blades 30a, 30b . . . make up a rotor fan 30, which is supported by a magnet yoke 29 on a shaft 33. The shaft 33 communicates with a bearing 27, which is in contact with a spacer 26 and a thrust bearing 25, which is adjacent to a suction yoke 21.

In this thin fan motor with heat sink attached 200, although the heat radiation blocks 32a, 32b . . . are set just outside the reach of the rotor blades 30a, 30b . . . , the stator coil 23 and the rotor magnets 28 are concentrated on the central axis area, and because of the necessity of assuring rotating space for the rotor blades 30a, 30b . . . at the outer edge and the limit on the width measurement to which the heat radiation blocks 32a, 32b . . . can rise, there is a limit to how thin the overall thickness of the fan motor can be and still allow an adequate volume of air.

Because the heat radiation blocks 32a, 32b . . . are of nearly fixed thickness at points in a circle centered on the rotating axis of the fan motor and are lined up in a ring, there is some resistance when the moving air strikes the heat radiation block 32a, 32b . . . and the air does not exit smoothly. And because the rotor blades 30a, 30b . . . are small in blade area, they have little capacity to move air. Therefore, the available cooling effect is not as great as expected.

One other factor is the structural relationship of the rotor fan 30 and the air intake 40 in the side cross section shown in FIG. 6. That is, the structural relationship between the size of the blade area (30a, 30b . . . ) of the rotor fan 30 and the opening of the air intake 40 will limit the air movement capacity during rotation, and the lack of air volume will have a great effect on the performance. The major factor is that, as stated above, there is some resistance when the moving air strikes the heat radiation block 32a, 32b . . . and the air does not exit smoothly. However, what is required is overall redesign of the rotor to provide high efficiency, and reconsideration of the shape and layout of the heat radiation blocks, as well as reconsideration of the structure combining those elements.

SUMMARY OF THE INVENTION

The cooling devices mounted in notebook personal computers at present primarily use an exhaust fan motor, or the method of natural radiation of heat, indirectly from the outside surface, using the underside of the keyboard or a metal part on the outer case. However, because of an increase in the amount of heat produced resulting from CPUs that are much faster and have much higher performance, there is a need for new cooling devices. This is not limited to notebook personal computers; it is anticipated that such devices will be mounted in all types of the next generation of computers, such as intelligent desktops, that will be marketed.

In this situation, the very thin fan motor with heat sink attached has attracted attention as a cooling means to deal with heat in equipment with CPUs with rapidly improving performance. The cooling means will make it possible to use the next era of GHz-class CPUs in high-performance personal computers that can assure stable processing speeds with extremely high performance.

This invention provides a very thin fan motor with heat sink attached that has excellent heat-radiation cooling efficiency and adequate performance even in a very thin, flat fan motor with external measurements about 30 mm square and 3 mm thick. Structurally, the fan motor has a small number of parts, is light and thin, and can be assembled easily by an automatic assembler. Because of unit construction with inexpensive parts, the fan motor can be mass produced. It resolves the heat production problem of electronic parts described above, and so the invention provides a very thin fan motor with heat sink attached that can be applied in a wide range of fields, including office automation and factory automation equipment as well as mobile and portable terminals such as high-performance notebook personal computers.

The very thin fan motor with heat sink attached of this invention is a flat fan mounted in various kinds of electronic equipment that need to radiate heat, and particularly mounted directly on the CPU, characterized by having a fan motor mechanism that comprises a heat plate that supports a rotor fan that can rotate in a central position and that has a contact surface that matches the shape of the external surface of the item (such as a CPU) to be cooled, rotor magnets that are part of the rotor fan and are positioned around the periphery on the surface of the heat plate, and a stator coil substrate; by having multiple thin metal heat radiation fins with excellent thermal conductivity arranged in parallel at a fixed interval above the heat plate outside the rotor fan as cooling heat-radiation fins; and by combining the function of cooling heat sink with the heat radiation fins that conduct the heat absorbed from the heat plate and radiate it away by the action of the air moved by the rotor fan.

The very thin fan motor with heat sink attached of this invention is also one in which the multiple heat radiation fins each have an opening large enough to accommodate with adequate turning room a rotor fan, and are stacked on the heat plate, an air intake with a diameter smaller than the diameter of the rotor fan is placed over the center of the heat plate, and the coils of a stator unit molded of a polymer together with the circuit board around the periphery of the air intake are located facing the heat plate, and the magnets of the rotor unit that includes the supported rotor fan are driven magnetically.

In the very thin fan motor with heat sink attached of this invention, multiple heat radiation fins are stacked with a given interval between them and are connected by a heat conducting material or fittings, and in at least two diagonally opposed corners of the multiple heat radiation fins, the heat sink unit and the stator unit are fixed together in a simple assembly process using pressure, bonding, welding or long screws.

In the very thin fan motor with heat sink attached of this invention, there is a heat plate formed of a material with excellent thermal conductivity, such as a precious metal (gold, silver etc) or copper, or a material that is partially diamond crystal (such as a CVD diamond substrate), and the heat sink assembled on the heat plate is a stack of metal heat radiation fins made of copper or aluminum.

Also, in the very thin fan motor with heat sink attached of this invention, the blades of the rotor fan are each formed in the same gentle arc, and in the inner portion of the inner/outer two-step multi-blade form of the rotor fan, the blade is set at an angle to move the air through the openings in the direction of rotational thrust toward the air intake, and outward from the central section, the blade angle pushes the air in the radial direction of rotation, which is toward the outer periphery of the rotor fan, and the step that reaches beyond the raised central portion of the heat plate reaches down toward the object being cooled, in such a way that the outer step of the curved blades of the rotor fan is near to the stacked heat radiation fins, the rotor fan with two-step blades being shaped like an inverted saucer.

DETAILED DESCRIPTION OF THE INVENTION

Figure 1:
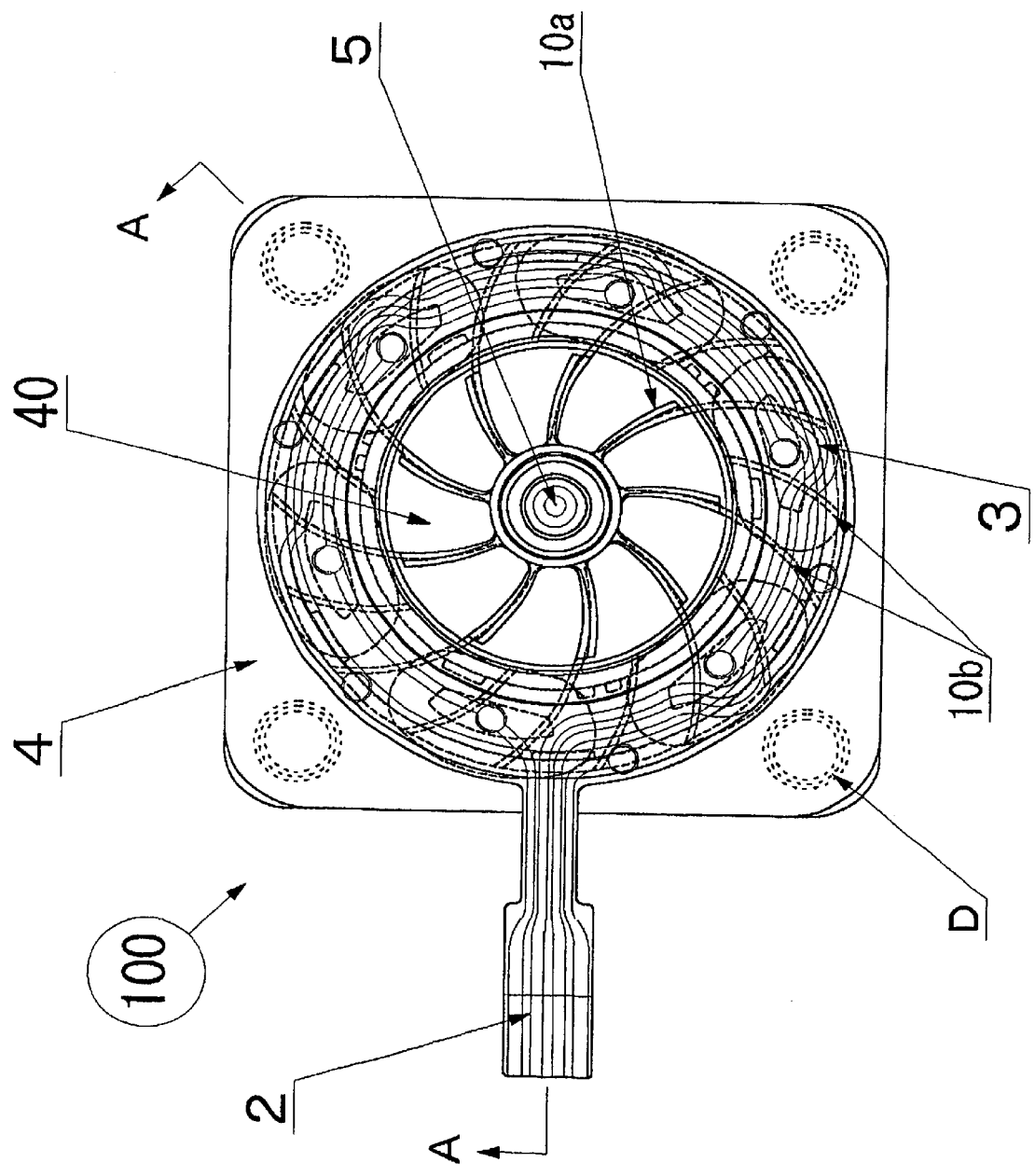
FIG. 1 illustrates a conceptual plane view showing the structure of the fan motor with attached heat sink of this invention.

The very thin fan motor with heat sink attached 100 of this invention is explained below with reference to FIGS. 1 through 4. FIG. 1 (which differs from the actual outward appearance in order to explain the internal structure) and figure are a conceptual plane view and cross section showing the structure of the thin fan motor. FIG. 3 is an exploded oblique view showing the constitution of parts of the fan motor as a whole, and FIG. 4 is a conceptual plane view showing the flat motor fan with rotating blades that incorporate magnets.

Figure 2:
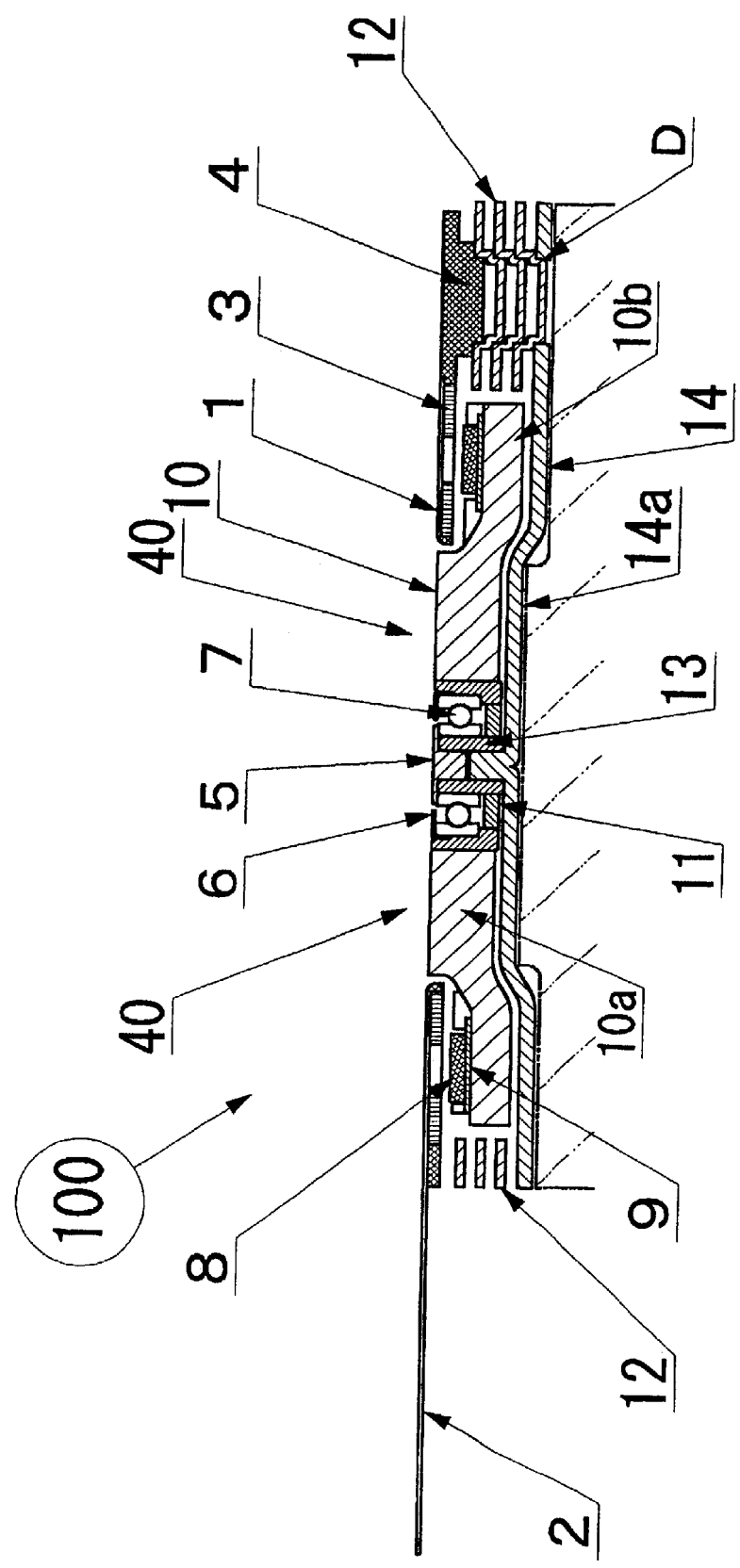
FIG. 2 illustrates a conceptual cross section, taken at line A—A of FIG. 1, showing the structure of the fan motor with attached heat sink of this invention.
Figure 3:
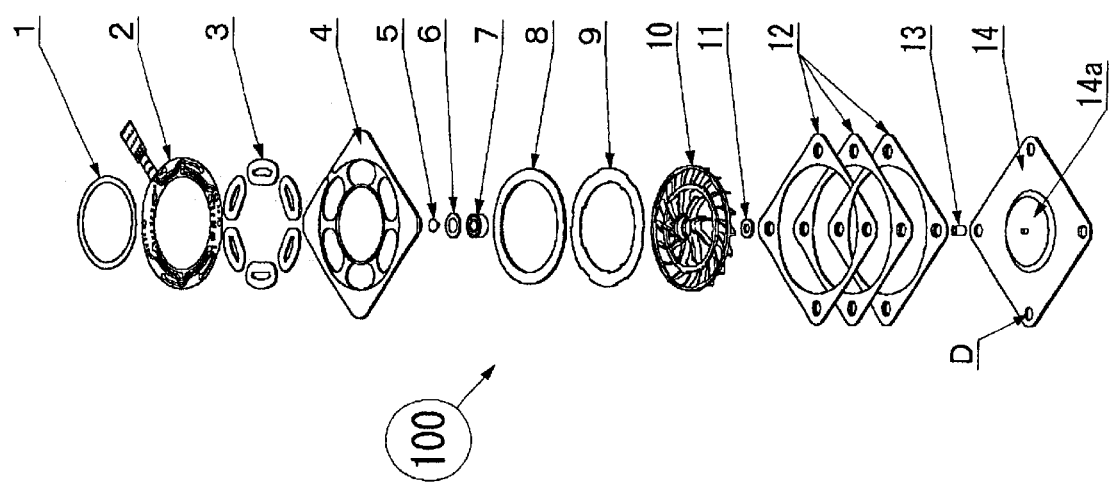
FIG. 3 illustrates an exploded oblique view showing the constitution of parts of the fan motor with attached heat sink of this invention.

The basic structure of the very thin fan motor 100 of this invention is shown in FIGS. 1 through 3. It comprises three major units; these are the heat sink unit for cooling by radiation of heat, that has a metal heat plate 14 mounted directly on the CPU and heat radiation fins 12 held together by connectors D, a rotor fan 10 unit in which a shaft 13 is supported and the rotor fan 10 is free to turn on ball bearings 7 in the center of the heat plate 14, and driven by rare earth magnets 8 and a magnet yoke 9 fixed to the outer periphery of the rotor, and an electrical stator unit in which coils 3, FPC board 2 and suction yoke 1 are stacked within the thickness of a polymer sheet 4 and molded together and placed facing the outer periphery of the rotor. A spacer 11, a bearing cover 6 and a stopper 5 are adjacent to the ball bearings 7 and the shaft 13.

The principle of operation is that of an opposed three-phase brushless motor rotary drive mechanism with a magnetic drive circuit that combines elliptical wound coils 3 located at equal distances on the polymer sheet 4 of the stator unit with ring-shaped rare earth magnets 8 fixed to the rotor fan 10 of the rotor unit. Because the magnetic drive circuit is located at the outer periphery of the rotor, stable drive characteristics can be obtained.

Figure 4:
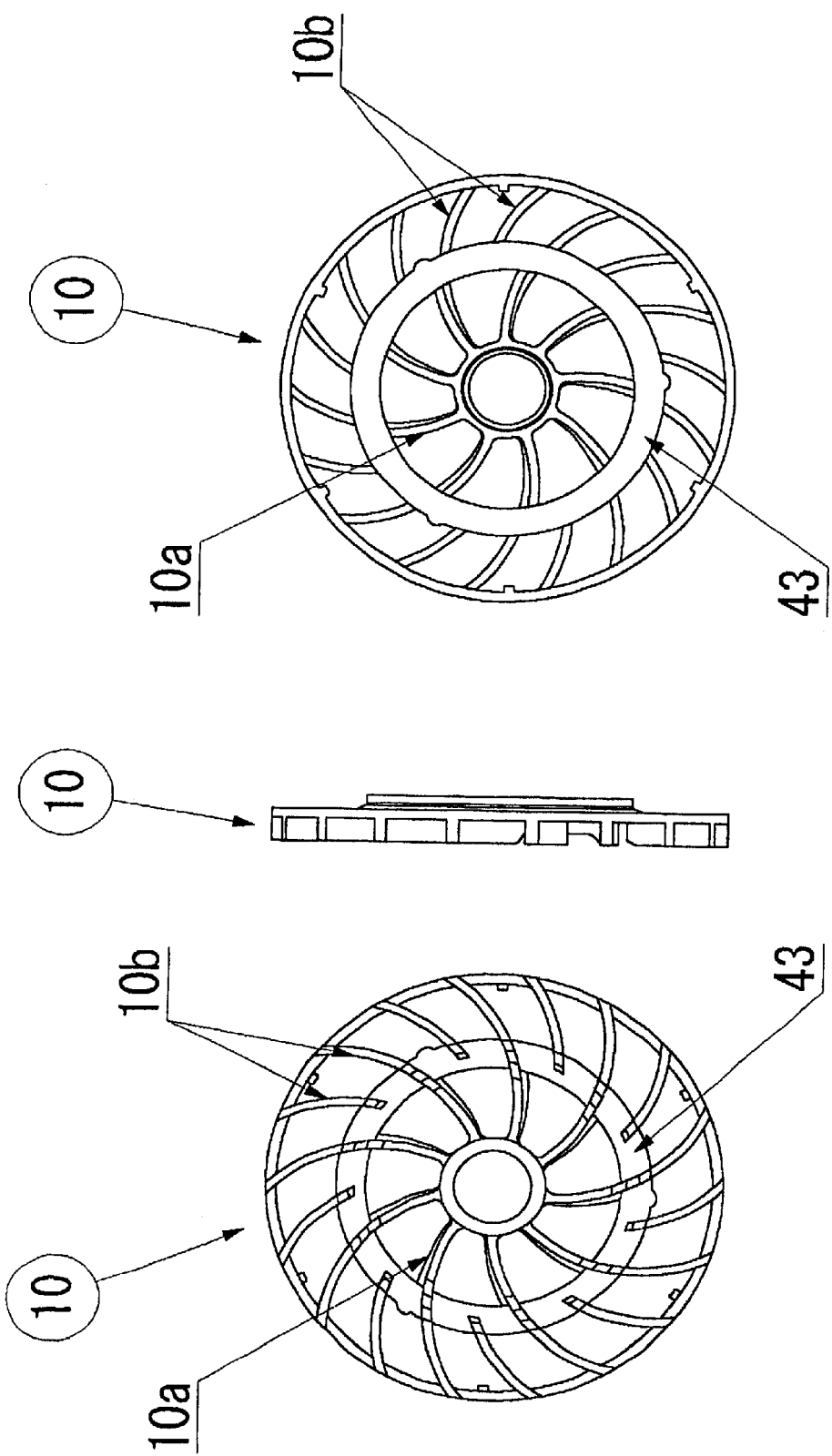
FIG. 4 illustrates plane and side views showing the motor fan part of the fan motor with attached heat sink of this invention.
Figure 5:
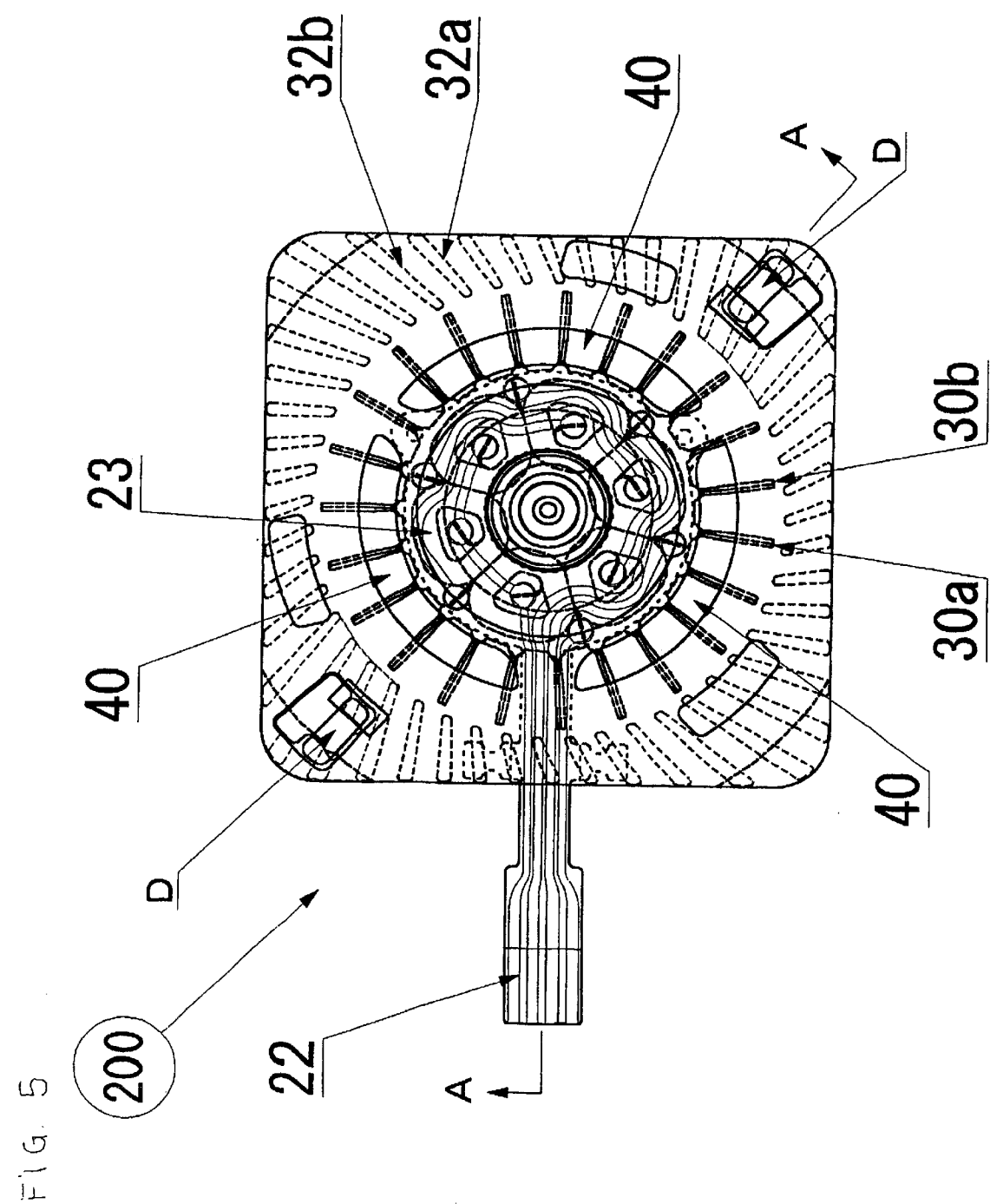
FIG. 5 illustrates a conceptual plane view showing the structure of a conventional fan motor with attached heat sink.
Figure 6:
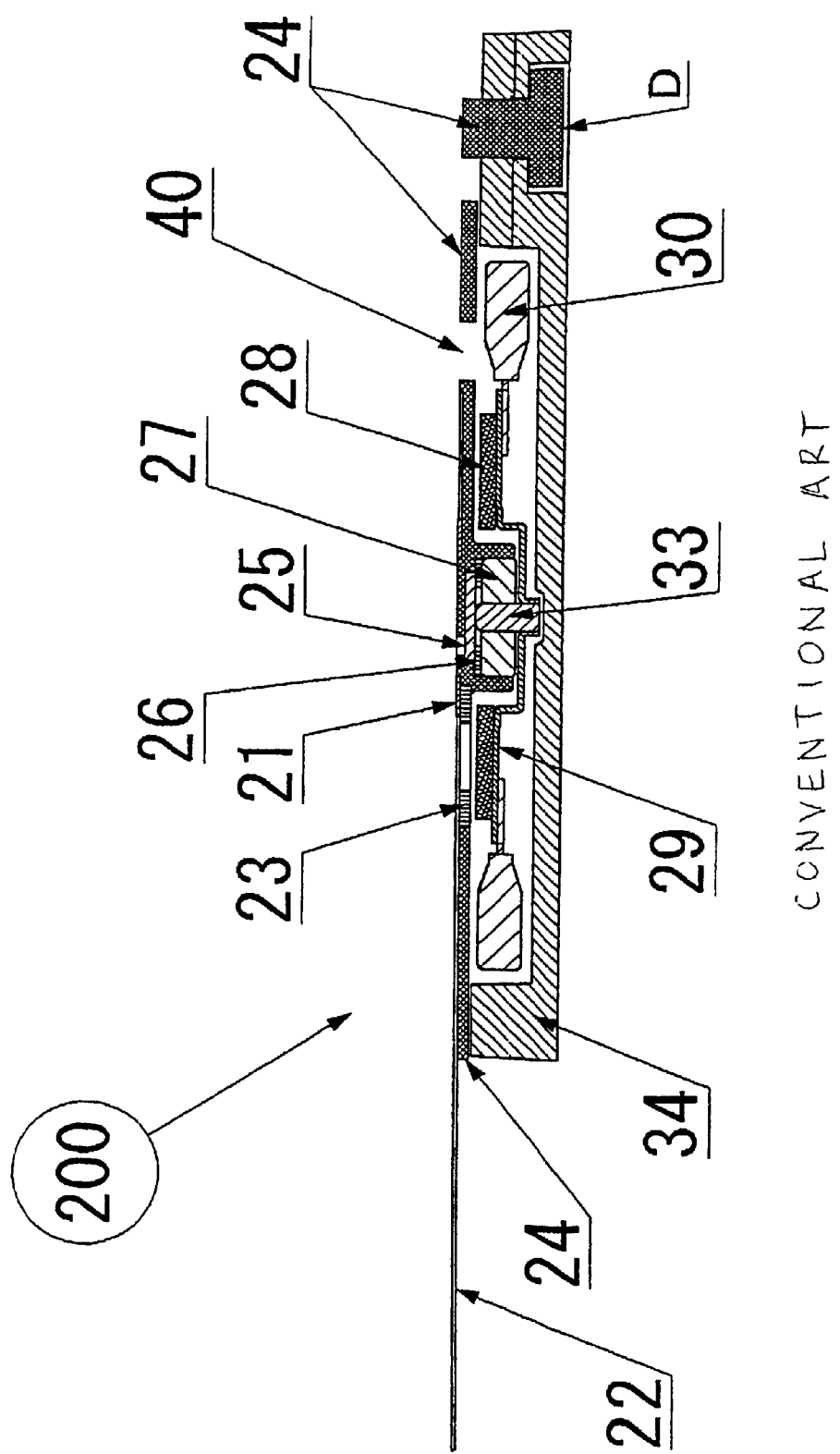
FIG. 6 illustrates a conceptual cross section, taken at line A—A of FIG. 1, showing the structure of a conventional fan motor with attached heat sink.

With regard to the shape characteristics of the rotor fan 10 shown in FIG. 4, while the spindle height (thickness) measurement of the fan motor is limited, air movement can be maximized by having the stepped inner blade 10a portion of the rotor fan 10 move air in the spindle direction, perpendicular to the surface of the heat plate 14, and having the stepped outer blade 10b portion push air in a circumferential direction, toward the edge of the heat sink unit.

That is, inward from the central step 43 of the inner/outer two-step blade shape of the rotor fan 10, the blade angle is set to push air most efficiently from the rotating spindle thrust openings in the direction of the air intake. Outward from the central step 43, the blade angle is set to push air in the radial direction, which is toward the outer circumference of the rotor fan 10.

In the structure of this rotor fan unit, the important thing is how to assure the volume of air delivered in a thin space; another big point of the design is how to efficiently expel the air drawn into the fan motor. At the same time, design consideration was given to design of the shape of the blade, in order to reduce the rotor fan's noise level.

From the perspective of weight and compactness, consideration was given to restricting the thickness of individual parts to tenths of millimeters if possible, and to the strength of the materials used. For the rotor fan, especially, precision polymer injection molding technology was used from the perspectives of lightness, precise shaping of parts, and strength, while at the same time keeping the cost down.

The mode of use of the completed very thin fan motor when cooling is to fix the lower surface of the heat plate 14 in direct contact with the upper surface of the CPU in a thin notebook personal computer. The heat produced by the CPU itself is radiated out by the heat sink unit which is a combination of the heat plate 14 and the multiple heat radiation fins 12 that have good thermal conductivity, and the repeated intake, transport and expulsion of air by the rotating blades of the rotor fan 10, further cools the CPU.

In addition, the raised portion 14a in the center of the heat plate 14 was designed to suit the highest performance CPU models of recent years which have a rectangular convexity on the upper surface of the CPU, so as to maintain direct contact in view of the shape of that convexity. In actuality, that rectangular convexity is the location that produces the most heat, and so cooling is increasingly necessary approaching the center.

In cooling evaluation tests of the assembled fan motor as a completed product, it was set in the most advanced notebook personal computer (CPU 650 MHz) actually on the market and tested in the normal operating climate, with initial goals of 7000 rpm rated rotation rate and no more than 50 mA rated current. The result was that it fully satisfied the standard specifications of 1.7° C./W with noise not exceeding 30 dB.

Thus this invention is one in which the cooling fan, a fan motor which is also a heat sink, is mounted directly on the CPU. The heat from the CPU, which is the heat-producing object, is absorbed by the heat plate unit, and the air moved in the perpendicular direction by the rotating blades of the rotor fan is able to forcefully separate the thermal layer that has formed on the surface of the heat plate, and can dramatically improve the radiation of heat and the index of heat conductivity.

To assure an effective area for heat radiation as the fan mechanism was made thinner, various experiments were made using slit-shaped heat radiation fins in which multiple thin fins were stacked together, including heat sink units assembled with metal heat radiation fins made of copper (aluminum is also possible) located on the heat plate, or using as a base material a heat plate made of a precious metal with excellent thermal conductivity (copper is also possible) or a heat plate with diamond crystals covering a portion. These experiments confirmed that it would be possible to assemble a very thin fan motor with better efficiency and excellent cooling performance by using these most suitable materials, if the cost aspect were ignored.

As stated above, using the fan motor with heat sink attached of this invention to accommodate with adequate turning room a large diameter, multi-bladed rotor fan, the opening of the air intake being located over the center of the plate surface and a heat sink unit to conduct heat being assembled from multiple thin heat radiation fins that are stacked parallel to each other with a given interval between and a heat plate that contacts the CPU, it is possible to obtain a very thin fan motor with heat sink attached, measuring 3 mm thick and about 30 mm square, having good air transport efficiency from intake to expulsion and having excellent cooling capacity.

Moreover, using the fan motor with heat sink attached of this invention, it is possible to put together a thin, flat fan motor with a very thin design which is just the thickness of the heat plate combined with the height of the stack of heat radiation plates and the thickness of the coils of the unitary polymer stator unit. In at least two diagonally opposed corners of the multiple heat radiation fins, the heat sink unit and the stator unit are fixed together in a simple assembly process using bonding, welding or long screws, and so it is possible to assemble the fan motor easily, even using relatively simple automatic equipment.

Moreover, by matching the shape of the contact portion of the heat plate to the external shape of the surface of the object to be cooled and giving maximum consideration to the area of contact with the heat producing CPU, and by using a stack of heat radiation fins that are parallel to each other, it is possible to assure a large effective heat radiation area. The air that is transported by a multi-bladed rotor fan with a large blade area is moved in the perpendicular direction and concentrated on the central raised portion of the heat plate, and then moves to the thin heat exchange fins at the outer periphery of the rotor fan where the resistance is least, and where an efficient heat exchange from the thin heat radiation fins to the air is possible. Therefore, it is possible to forcefully and efficiently disperse the heat that is conducted from the CPU through the heat plate to the heat radiation fins.

In other words, using the fan motor with heat sink attached of this invention, it is possible to increase the volume of air moved in the vertical direction by means of large rotor fan blades with an inner/outer two-step blade structure, to forcefully separate the layer of heat that is formed on the central surface of the heat plate, and at the same time to push the separated hot air outward to the periphery of the rotor fan by means of the outer step of the blade, and so it is possible to markedly improve the heat radiation and thermal conductivity, and to improve the cooling efficiency, even in a very thin, flat fan motor only 3 mm thick.

Also, using the fan motor with heat sink attached of this invention, an air intake with a diameter smaller than the diameter of the rotor fan is placed over the center of the heat plate; the coils of the stator unit that is molded of a polymer together with the circuit board around the periphery of the air intake are located facing the heat plate, and the magnets of the rotor unit that includes the supported rotor fan are driven magnetically. Therefore, viewed as a flat brushless motor, it is possible to enlarge the diameter of the arrays of magnets and coils in the magnet drive circuit without the conventional concern regarding inadequate torque, and the drive action is smooth and stable.

Also, using the fan motor with heat sink attached of this invention, the heat plate is made of a material with excellent thermal conductivity, such as a precious metal or copper, or a material that is partially diamond crystal, and the heat sink assembled on the heat plate is a stack of metal heat radiation fins made of copper or aluminum. Therefore, it is possible to provide a heat sink capable of rapidly conducting heat to the heat radiation fins from the heat plate mounted on the object generating heat.

Also, using the fan motor with heat sink attached of this invention, the blades of the rotor fan are each formed in the same gentle arc, and in the inner portion of the inner/outer two-step multi-blade form of the rotor fan, the blade angle moves the air through the openings in the direction of rotational thrust toward the air intake, and outward from the central section, the blade angle pushes the air in the radial direction of rotation, which is toward the outer periphery of the rotor fan. The step that reaches beyond the raised central portion of the heat plate and reaches down toward the object being cooled, in such a way that the outer step of the curved blades of the rotor fan are near to the stacked heat radiation fins. Shaped like an inverted saucer, viewed from the edge, this rotor fan has two-step blades with a large area, and so it is possible to move a greater volume of air and efficiently cool the heat plate and heat radiation fins of the heat sink unit. At the same time, there is no need to increase the rotation rate of the rotor fan because of the large blade area, and so it is possible to have a low-noise fan motor with no sound of the fan cutting the air.

Therefore, using the fan motor with heat sink attached of this invention, it is possible to directly air-cool the heat-producing CPU that is the major component in the PC, even the thin, high-performance notebook personal computers that have become established as a portable terminal tool of business. Therefore, it is possible to suppress the reduction of CPU performance due to heat production, to eliminate an element of instability in CPU operation, and thus to develop new models of very thin, high-performance notebook PCs in which are mounted CPUs that perform comfortably at higher levels.

What is claimed is:

1. A very thin fan motor with heat sink attached which is a fan motor mounted in various kinds of electronic equipment that need to radiate heat, for the purpose of using air for a cooling effect;

characterized by having a fan motor mechanism that comprises a heat plate that supports a rotor fan that can rotate in a central position and that has a contact surface that matches the shape of an external surface of an object to be cooled, rotor magnets that are part of the rotor fan and are positioned around a periphery of the rotor fan, and a stator coil substrate;

by having blades of the rotor fan each formed in a same gentle arc, and in an inner portion of an inner/outer two-step multi-blade form of the rotor fan, the blade being set at a first angle to move the air through openings in the direction of rotational thrust toward an air intake, and outward from a central section, the blade which is set at a second angle different than said first angle pushing the air in the radial direction of rotation, which is toward the outer periphery of the rotor fan, and the outer step that reaches beyond a raised central portion of the heat plate reaching down toward the object being cooled, in such a way that the outer step of the arced blades of the rotor fan is near to stacked heat radiation fins, the rotor fan with the two-step multi-blade form being shaped like an inverted saucer;

by having multiple thin metal heat radiation fins with excellent thermal conductivity arranged in parallel at fixed intervals above the heat plate outside the rotor fan as cooling heat-radiation fins;

and by combining the function of cooling heat sink with the heat radiation fins that conduct the heat absorbed from the heat plate and radiate it away by the action of the air moved by the rotor fan;

wherein multiple heat radiation fins each having an opening large enough to accommodate with adequate turning room a rotor fan, are stacked on the heat plate, an air intake with a diameter smaller than the diameter of the rotor fan being placed over the center of the heat plate, and coils of a stator unit that is molded of a polymer together with a circuit board around a periphery of the air intake being located facing the heat plate, and the magnets of the rotor unit that includes the supported rotor fan being driven magnetically.

2. A very thin fan motor with heat sink attached as described in claim 1, in which multiple heat radiation fins are stacked with a given interval between them and are connected by a heat conducting material or fittings, and in at least two diagonally opposed corners of the multiple heat radiation fins, a heat sink unit and a stator unit are fixed together in a simple assembly process.

3. A very thin fan motor with heat sink attached as described in claim 2, in which there is a heat plate formed of a material with excellent thermal conductivity or a material that is partially diamond crystal, and the heat sink assembled on the heat plate is a stack of metal heat radiation fins made of copper or aluminum.

4. A very thin fan motor with heat sink attached as described in claim 1, in which there is a heat plate formed of a material with excellent thermal conductivity or a material that is partially diamond crystal, and the heat sink assembled on the heat plate is a stack of metal heat radiation fins made of copper or aluminum.

5. A very thin fan motor with heat sink attached as described in claim 4, wherein the material with excellent thermal conductivity is precious metal or copper.

\* \* \* \* \*